United States Patent
Feeney et al.

(10) Patent No.: US 6,700,938 B1
(45) Date of Patent: Mar. 2, 2004

(54) METHOD FOR DETERMINING QUALITY OF TRELLIS DECODED BLOCK DATA

(75) Inventors: Gregory A. Feeney, Palatine, IL (US); Gerald Jones, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/408,400

(22) Filed: Sep. 29, 1999

(51) Int. Cl.[7] .............................................. H04L 23/02
(52) U.S. Cl. ..................................................... 375/265
(58) Field of Search ................................ 375/316, 341, 375/265, 262, 220; 714/795, 796, 792, 791

(56) References Cited

U.S. PATENT DOCUMENTS

| | | | |
|---|---|---|---|
| 5,574,751 A | * 11/1996 | Trelewicz ...................... | 375/265 |
| 5,687,188 A | * 11/1997 | Feeney et al. ................ | 375/220 |
| 5,710,784 A | * 1/1998 | Kindred et al. .............. | 375/262 |
| 5,737,365 A | * 4/1998 | Gilbert et al. ............... | 375/224 |
| 5,862,190 A | * 1/1999 | Schaffner ...................... | 375/341 |
| 5,878,098 A | * 3/1999 | Wang et al. .................. | 375/377 |
| 5,940,454 A | * 8/1999 | McNicol et al. ............ | 375/347 |
| 6,094,465 A | * 7/2000 | Stein et al. ................... | 375/346 |
| 6,108,374 A | * 8/2000 | Balachandran et al. ...... | 375/227 |
| 6,175,590 B1 | * 1/2001 | Stein ............................. | 370/252 |
| 6,219,389 B1 | * 4/2001 | Pappas et al. ............... | 375/341 |
| 6,370,189 B1 | * 4/2002 | Morrison et al. ............ | 375/224 |
| 6,378,106 B1 | * 4/2002 | Allpress et al. .............. | 714/795 |
| 6,459,746 B2 | * 10/2002 | Agazzi et al. ............... | 375/371 |

OTHER PUBLICATIONS

Hirosuke Yamamoto SNF Kohji Itoh, *Viterbi Decoding Algorithm for Convolutional Codes with Repeat Request*, IEEE Transactions on Information Theory, Vol IT–26, No. 5, Sep. 1980, pp. 540–541.

* cited by examiner

*Primary Examiner*—Emmanuel Bayard
(74) *Attorney, Agent, or Firm*—Steven R. Santema; Valerie M. Davis

(57) ABSTRACT

A method of determining a quality metric for a message. The method comprises receiving (500) a message, constructing (502) a trellis array associated with the message, and determining (512) a quality metric for the message based on the trellis array. In one embodiment, the quality metric is derived from state information obtained from selected columns in the trellis array. The state information may include target states defining correct and/or incorrect transitions in the selected columns. The quality metric comprises in one embodiment a cumulative number of the occurrences of the target states in the selected columns.

15 Claims, 2 Drawing Sheets

METHOD FOR DETERMINING QUALITY OF TRELLIS DECODED BLOCK DATA

FIELD OF THE INVENTION

This invention relates to digital communication systems, including but not limited to radio frequency (RF) digital communication systems.

BACKGROUND OF THE INVENTION

Digital communication systems often employ forward error correction coding techniques in which input signals are encoded prior to modulation and transmission over a communications channel (e.g., an RF channel) by adding redundant bits that can be used for the detection and correction of errors. At the receiver, the signal is demodulated and decoded, yielding received sequences of bits ("received signals") that may differ from the input signal due to the effects of various channel impairments such as, for example, noise, fading or interference. Various coding/decoding methods have been developed for the purpose of detecting and correcting errors in the received signals.

Hard decoding methods employ slicing the received samples into a predetermined set of quantized values (e.g., "0" or "1" in a binary system). Forward error correction is performed on the recovered quantized values using methods such as, for example, Golay, Reed-Solomon, or Hamming codes, as are well known in the art. Hard decision codes use a parity matrix to recover each transmitted symbol, thereby allowing for counting the errors found in the received signal yielding a bit error count or bit error rate which may be used to judge the quality of the communication channel. The ability to judge channel quality with a quantifiable value such as a bit error count is useful for a variety of reasons, as will be appreciated by those skilled in the art. For example, where signal(s) are received from multiple sites, bit error counts allow for determining the best of the multiple received signals. Generally, however, hard decision codes, notwithstanding their advantages, are less effective in terms of error correction capability than soft decision codes.

Soft decision codes operate upon received blocks of data derived from a convolutional encoder (e.g., by time-shifting input bits through a shift register). The "state" of an encoder at any given time is characterized by the rightmost K–1 bits in the shift register, where K is the number of stages of the shift register. For example, in a convolutional encoder with a 3-stage shift register, the possible states are the rightmost two bits of the encoder (e.g., 00, 10, 01 or 11). The possible states and transitions between states of a convolutional encoder may be represented by a trellis diagram. Soft decision decoding is usually implemented with a Viterbi or trellis type decoder which, in essence, works backwards through the trellis to determine the most likely input signal, as is known in the art.

Generally, soft decision decoding allows for better performance than hard-decision decoding but there is no way for soft decision decoders to determine an exact bit error count or bit error rate to quantify the success of the decoding algorithm. It is known that a quality value for soft decision decoders may be derived from a minimum path metric associated with the Viterbi algorithm. However, such quality value is based on summing the noise difference between a number of received signals and the most likely input signal and is subject to fairly wide variations depending on the precision of the digital processor being used. For example, in ASTRO™ digital data systems, available from Motorola, Inc., the value derived from the minimum path metric is dependent on the unsliced symbol values and their corresponding signal strength, each of which is affected by the front end processing performed in the receiver. Thus, the value derived from the minimum path metric can range from 1 to $2^{-23}$ in the ASTRO™ systems. Quality values having such a wide variations are of limited utility in comparing signal(s) received from multiple sites unless the value can be "normalized" (e.g, compressed or scaled) between sites. However, normalization is difficult, at best, where the quality value is so dependent on properties of receivers because those properties can vary, over time, or can change as the receivers are replaced or maintained in the field.

Accordingly, there is a need for determining a quantifiable value for measuring the quality of trellis decoded block data, which value is independent of variations between receivers and may be used in communication systems to compare the quality of signals received from multiple sites. The present invention is directed to satisfying or at least partially satisfying this need.

BRIEF DESCRIPTION OF THE DRAWINGS

The foregoing and other advantages of the invention will become apparent upon reading the following detailed description and upon reference to the drawings in which.

DESCRIPTION OF PREFERRED EMBODIMENTS

The present invention provides a method of determining a quality metric for a message. The method comprises receiving the message, constructing a trellis array associated with the message, and determining a quality metric for the message based on the trellis array. The message may comprise a block of data, the trellis array may be constructed using trellis block decoding methods, including but not limited to Viterbi decoding methods, and the quality metric may be derived from state information obtained from selected columns in the trellis array. The state information may include a number of occurrences of target states in the selected columns, wherein the target states optionally define most likely previous transitions (i.e., correct states) or incorrect states. In one embodiment, the quality metric comprises a cumulative number of the occurrences of the target states in the selected columns.

Figure 1:
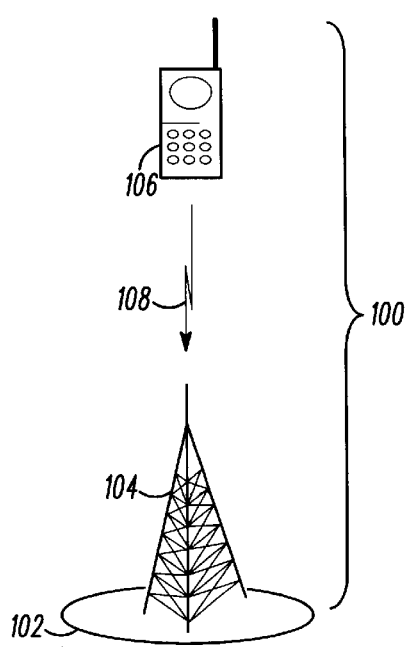
FIG. 1 is a block diagram of a communication system including a base station embodying principles of the present invention.

Turning now to the drawings and referring initially to FIG. 1, there is shown a communication system 100 including a communication site 102 with an associated base station 104, such as a QUANTAR® Base Station available from Motorola, Inc. A communication unit 106 transmits an encoded digital message over an RF communications resource (channel) 108 that may be received at the communication site 102 by the base station 104. The communication site 102 may then decode the message, retransmit the message to other communication units (not shown) or forward the message to a dispatch center, data controller or gateway, computer aided dispatch controller, or Key Management Controller as is known in the art. As will be described in greater detail herein, the present invention may be embodied in the system of FIG. 1 to judge the quality of the message received by the communication site 102.

It will be appreciated that the system of FIG. 1 is exemplary only. The present invention may be used in virtually any type of communications system operable to receive digital messages, including wireline and wireless systems. Moreover, although only one site is shown in FIG. 1, the present invention may be employed in a communication system with multiple sites. Where multiple sites are employed, the communication system usually includes a voter, also known as a comparator (not shown), that receives and compares the signals from the multiple sites, ultimately selecting one of the messages or constructing a composite message for retransmission throughout the communication system. The present invention may be advantageously employed in such multi-site systems to determine a quality value for each signal received by the comparator, thereby enabling the comparator to choose the best signal by comparing the quality values of the received signals.

Figure 2:
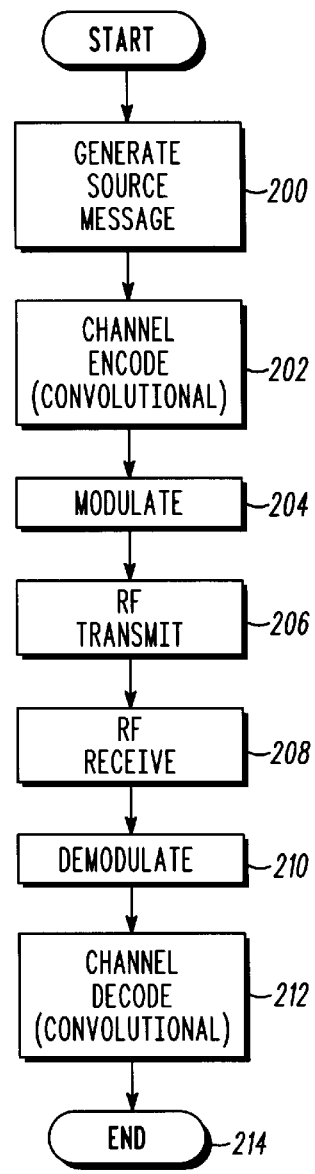
FIG. 2 is a flowchart illustrating various steps in the communication system of FIG. 1.

FIG. 2 is a flowchart illustrating various steps in the communication system of FIG. 1. The process begins at step 200 with the generation of a digital source message at the communication unit 106. The message is channel-encoded at step 202 with a trellis-type convolutional encoder defining a part of the communication unit 106. Generally, the trellis encoder adds redundant bits to the digital source message that can be used for the detection and correction of errors. The encoded signal is modulated (step 204) and transmitted (step 206) via a radio frequency (RF) communication resource, then received (step 208) and demodulated (step 210) at the base station 104 to convert the incoming signal to baseband and intermediate frequencies, as is well known in the art. At step 212, the encoded signal is decoded, using a trellis-type decoder that produces a trellis array defining a sequence of states and branches, then the decoder applies the Viterbi algorithm to the received message in order to decode the received message. The Viterbi algorithm is well known in the art and is described in *Digital Communications, Fundamentals and Applications*, by Bernard Sklar, published by Prentice-Hall in 1988, as well as numerous other references. The process ends at step 214 with a decoded message that may be retransmitted to other communication units or forwarded to a dispatch center, data controller or gateway, computer aided dispatch controller, or Key Management Controller as heretofore described.

Figure 3:
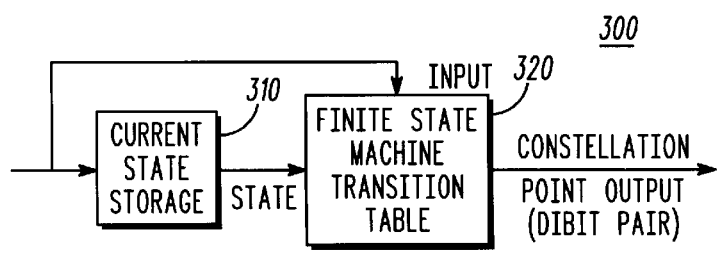
FIG. 3 is a block diagram of a representative trellis encoder that may be used in the system of FIG. 1.

FIG. 3 is a block diagram of an exemplary trellis encoder 300 that may be used for channel encoding (step 202) the digital source message in the system of FIG. 1. The particular trellis encoder 300 shown in FIG. 3 is used in Motorola's ASTRO™ radio communication systems. It will be appreciated, however, that the present invention is not limited to use with ASTRO™ radio communication system, or for use with any particular type of trellis encoder. Generally, trellis encoders are adapted to receive, k bits at a time, an input message defining a sequence of data bits and then transform that input sequence into an output sequence made up of various branch words made up of n binary code symbols, often called channel symbols, channel bits, or coded bits. Since there are n coded bits for each input group of k message bits, the code rate of the trellis encoder is k/n message bit per coded bit. The trellis encoder 300 of FIG. 3 is adapted to receive either two (i.e., k=2) or three (i.e., k=3) bits at a time and output four bits (i.e., n=4) for each group of input bits. More specifically, the trellis encoder 300 receives an input stream of 2-bit "dibits" or 3-bit "tribits" and outputs a stream of 4-bit "dibit pairs." Thus, for every m dibits (or tribits) as input, the encoder outputs 2m dibits. For an input stream consisting of dibits, the code rate is ½ and for an input stream consisting of tribits, the code rate is ¾. The encoder appends either two zero bits (for k=2) or three zero bits (for k=3) at the end of the input data sequence to flush out the final state, as is known in the art. In one embodiment, the dibits on the output are mapped to +/−1, +/−3 amplitudes and interleaved before being modulated.

Generally, any particular sequence of k bits may be defined as one of the states of $2^k$-symbol alphabet. For example, in a binary system (k=1), there are only two possible states of the single bit, zero and one. In a quaternary system (k=2), there are four possible two-bit sequences (e.g., 00, 01, 10 and 11) and in an 8-ary system (k=3), there are eight possible three-bit sequences (e.g., 000, 001, 010, 011, 100, 101, 110 and 111). For convenience, the four possible states of the quaternary system will hereinafter be designated as states 0, 1, 2 and 3 and the eight possible states of the 8-ary system will hereinafter be designated as states 0, 1, 2, 3, 4, 5, 6 and 7.

The encoder 300 of FIG. 3 is implemented as a four-state finite state machine (FSM) for the rate ½ code and an 8-state finite state machine for the rate ¾ code. That is, there are four possible FSM states (e.g., 0, 1, 2 and 3) when the input stream consists of 2-bit "dibits" and there are eight possible FSM states (e.g., 0, 1, 2, 3, 4, 5, 6 and 7) when the input stream consists of 3-bit "tribits." The encoder 300 includes a Current State Storage Block 310 for storing the states of the input dibits (or tribits), in sequence, starting with an initial state of zero. The FSM Transition Block 320 produces a constellation point output for each new input dibit (or tribit), based on the state of the input dibit (or tribit) and the previous FSM state (from the Current State Storage Block 310). The constellation point is then represented as a dibit pair.

TABLE 1

Trellis Encoder State Transition Table (Rate ½)

|  | Rate ½ | Input | | | |
|---|---|---|---|---|---|
|  |  | 0 | 1 | 2 | 3 |
| FSM State | 0 | 0 | 15 | 12 | 3 |
|  | 1 | 4 | 11 | 8 | 7 |
|  | 2 | 13 | 2 | 1 | 14 |
|  | 3 | 9 | 6 | 5 | 10 |

TABLE 2

Trellis Encoder State Transition Table (Rate ¾)

| | Rate ¾ Input Tribit | | | | | | | |
|---|---|---|---|---|---|---|---|---|
| FSM State | 0 | 1 | 2 | 3 | 4 | 5 | 6 | 7 |
| 0 | 0 | 8 | 4 | 12 | 2 | 10 | 6 | 14 |
| 1 | 4 | 12 | 2 | 10 | 6 | 14 | 0 | 8 |
| 2 | 1 | 9 | 5 | 13 | 3 | 11 | 7 | 15 |
| 3 | 5 | 13 | 3 | 11 | 7 | 15 | 1 | 9 |
| 4 | 3 | 11 | 7 | 15 | 1 | 9 | 5 | 13 |

TABLE 2-continued

Trellis Encoder State Transition Table (Rate ¾)

| FSM State | Rate ¾ Input Tribit | | | | | | | |
|---|---|---|---|---|---|---|---|---|
| | 0 | 1 | 2 | 3 | 4 | 5 | 6 | 7 |
| 5 | 7 | 15 | 1 | 9 | 5 | 13 | 3 | 11 |
| 6 | 2 | 10 | 6 | 14 | 0 | 8 | 4 | 12 |
| 7 | 6 | 14 | 0 | 8 | 4 | 12 | 2 | 10 |

TABLE 3

Constellation to Dibit Pair Mapping

| Constellation Point | Dibit 0 | Dibit 1 |
|---|---|---|
| 0 | +1 | −1 |
| 1 | −1 | −1 |
| 2 | +3 | −3 |
| 3 | −3 | −3 |
| 4 | −3 | −1 |
| 5 | +3 | −1 |
| 6 | −1 | −3 |
| 7 | +1 | −3 |
| 8 | −3 | +3 |
| 9 | +3 | +3 |
| 10 | −1 | +1 |
| 11 | +1 | +1 |
| 12 | +1 | +3 |
| 13 | −1 | +3 |
| 14 | +3 | +1 |
| 15 | −3 | +1 |

Tables 1 and 2 above show state transitions for a rate ½ and rate ¾ encoder, and Table 3 shows a mapping of constellation points to dibit pairs. Depending on the input dibit (Table 1) or tribit (Table 2), and the previous FSM state, the output of the state transition table is one of 16 constellation points (e.g., 0, 1, 2 . . . 15) that are converted to dibit pairs according to the mapping of Table 3. For example, consider the rate ¾ encoder with an input data sequence of the tribits 4, 2, 1, 7, 0 . . . . For the first tribit in the sequence (e.g., "4"), the FSM state is the initial state of zero, thus the constellation point is "2." The dibit pair corresponding to the constellation point "2" is (+3, −3). For the next tribit (e.g., "2"), the FSM state is the previous tribit (e.g., "4"), thus the constellation point is "7". The dibit pair corresponding to the constellation point "7" is (+1, −3). For the next tribit (e.g., "1"), the FSM state is the previous tribit (e.g., "2"), thus the constellation point is "9". The dibit pair corresponding to the constellation point "9" is (+3, +3). For the input tribit "7," the FSM state is the previous tribit (e.g., "1"), yielding constellation point "8" and dibit pair (−3, +3), and for the input tribit "0," the FSM state is the previous tribit (e.g., "7"), yielding constellation point "6" and dibit pair (−1, −3).

Figure 4:
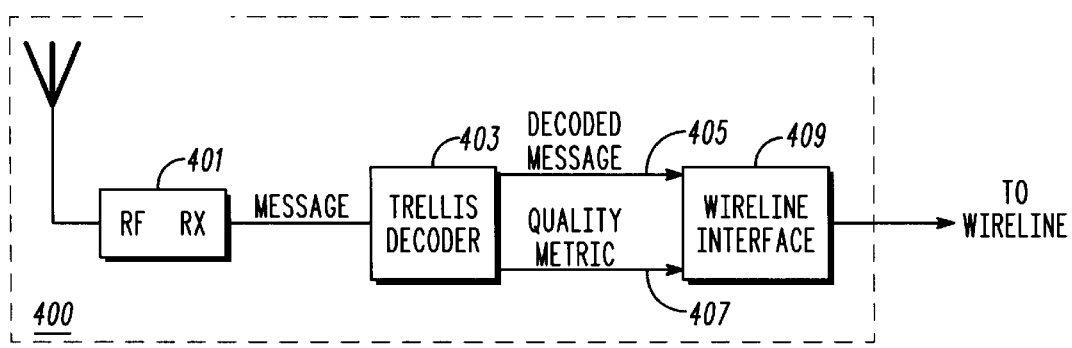
FIG. 4 is a block diagram of a base station receiver including a trellis decoder according to the present invention.

A block diagram of a base station receiver 400 is shown in FIG. 4. A message from a communication unit (e.g., a sequence of dibit pairs) is transmitted (FIG. 2, step 206) via an RF communication resource and is received (FIG. 2, step 208) by the RF receiver 401 of the base station receiver 400. The RF receiver 401 performs the functions of conversion of the incoming signal to baseband and intermediate frequencies, as is well known in the art, including In-phase (I) and Quadrature (Q) sample recovery; intermediate frequency filtering of the I and Q samples; discrimination of the I and Q samples; and calculation of the received signal strength of the I and Q samples. The result is a message that is sent to a trellis decoder 403. All of these elements of a base station receiver can be implemented using a DSP56002, available from Motorola, Inc., or with any of various other digital signal processors available.

The trellis decoder 403 applies the Viterbi algorithm to the received message in order to decode the message. The Viterbi algorithm is well known in the art and is described in *Digital Communications Fundamentals and Applications*, by Bernard Sklar, incorporated herein by reference in its entirety, as well as numerous other references. Essentially, the Viterbi algorithm decodes a received message by attempting to do the opposite of the encoder, by figuring out the most likely state transitions that were made in the encoder. Each of the output symbols (e.g., dibit pairs) of the encoder represent a state transition. For example, consider a received message consisting of m output symbols. For each of the m output symbols (e.g., dibit pairs), starting with the last pair with the a priori knowledge that the encoder is to finish in state zero, the Viterbi algorithm selects the most likely previous state from among the possible states and stores this in an array (i.e., "the trellis array"). Recall that for the encoder of FIG. 3 using a rate ¾ code, there are eight states (e.g., 0, 1, 2, 3, 4, 5, 6 and 7), thus the array comprises an 8×m array. For the rate ½ code, there are four possible states (e.g., 0, 1, 2 and 3), thus the array comprises an 4×m array.

TABLE 4a

| | Trellis Array Columns | | | | | | | | | |
|---|---|---|---|---|---|---|---|---|---|---|
| Next State | 0 | 1 | 2 | 3 | 4 | - - - | 44 | 45 | 46 | 47 | 48 |
| 0 | 2 | 0 | 1 | 3 | 1 | - - - | 2 | 1 | 3 | 3 | 2 |
| 1 | 2 | 0 | 2 | 3 | 1 | - - - | 2 | 2 | 3 | 1 | 2 |
| 2 | 2 | 0 | 1 | 3 | 1 | - - - | 0 | 0 | 3 | 1 | 0 |
| 3 | 2 | 3 | 1 | 3 | 1 | - - - | 2 | 0 | 3 | 1 | 2 |
| Occurrences of Correct State | 4 | 3 | 3 | 4 | 4 | | 3 | 2 | 4 | 3 | 3 |

TABLE 4b

| | Trellis Array Columns | | | | | | | | | |
|---|---|---|---|---|---|---|---|---|---|---|
| Next State | 0 | 1 | 2 | 3 | 4 | - - - | 44 | 45 | 46 | 47 | 48 |
| 0 | 2 | 0 | 1 | 3 | 1 | - - - | 2 | 1 | 3 | 3 | 2 |
| 1 | 2 | 0 | 2 | 3 | 1 | - - - | 2 | 2 | 3 | 1 | 2 |
| 2 | 2 | 0 | 2 | 3 | 1 | - - - | 0 | 3 | 3 | 1 | 2 |
| 3 | 2 | 0 | 2 | 3 | 1 | - - - | 2 | 0 | 3 | 1 | 2 |
| 4 | 2 | 0 | 1 | 3 | 1 | - - - | 2 | 0 | 3 | 1 | 2 |
| 5 | 2 | 0 | 1 | 3 | 1 | - - - | 2 | 0 | 3 | 1 | 2 |
| 6 | 2 | 0 | 1 | 3 | 1 | - - - | 0 | 0 | 3 | 1 | 0 |
| 7 | 2 | 3 | 1 | 3 | 1 | - - - | 2 | 0 | 3 | 1 | 2 |
| | 8 | 7 | 5 | 8 | 8 | - - - | 6 | 5 | 8 | 7 | 7 |

Example trellis arrays (partial) for decoding a 49-symbol data block are shown in Table 4a (for a rate ½ encoded block) and Table 4b (for a rate ¾ encoded block). Each of the example arrays have 49 columns (i.e., 0 to 48), corresponding to the 49 symbols in the data block. The array of Table 4a has four rows (i.e., 0, 1, 2 and 3) corresponding to the four possible states of a rate ½ encoded block, and the array of Table 4b has eight rows (i.e., 0, 1, 2, 3, 4, 5, 6 and 7) corresponding to the eight possible states of a rate ¾ encoded block. Once the trellis array is constructed, the Viterbi algorithm uses the a priori knowledge that the encoder ends in a known state (e.g., zero) to reverse trace through the array. In the trellis array of Table 4a, for example, the most likely previous state for state zero on the 49th transition is 2 (trellis [48] [0]), the most likely previous state for state 2 on the 48th transition is 1 (trellis [47] [2]), the most likely previous state for state 1 on the 47th transition is 3 (trellis [46] [1]), and so on until the entire trellis array is traced through. Similarly, in the trellis array of Table 4b, the most likely previous state for state zero on the 49th transition is 2 (trellis [48] [0]), the most likely previous state for state 2 on the 48th transition is 1 (trellis [47] [2]), the most likely previous state for state 1 on the 47th transition is 3 (trellis [46] [1]), and so on. In each of the examples, the italicized number in each column indicates the most likely previous state.

After the trace is complete, the Viterbi algorithm is able to determine a decoded message 405 based on the transitions shown in the array. The decoded message 405 is then output to a wireline interface block 409. For example, in the example trellis array of Table 4a, the trace indicates that the most likely transitions were 2→0→1→3→1→2 . . . →2→0→3→1→2→0, and the decoded message therefore comprises the tribits 2, 0, 1, 3, 1, 2 . . . 2, 0, 3, 1, 2. Similarly, in the example trellis array of Table 4b, the most likely transitions were 2→0→2→3→1→4 . . . →2→0→3→1→2→0, and the decoded message therefore comprises the tribits 2, 0, 2, 3, 1, 4 . . . 2, 0, 3, 1, 2.

Figure 5:
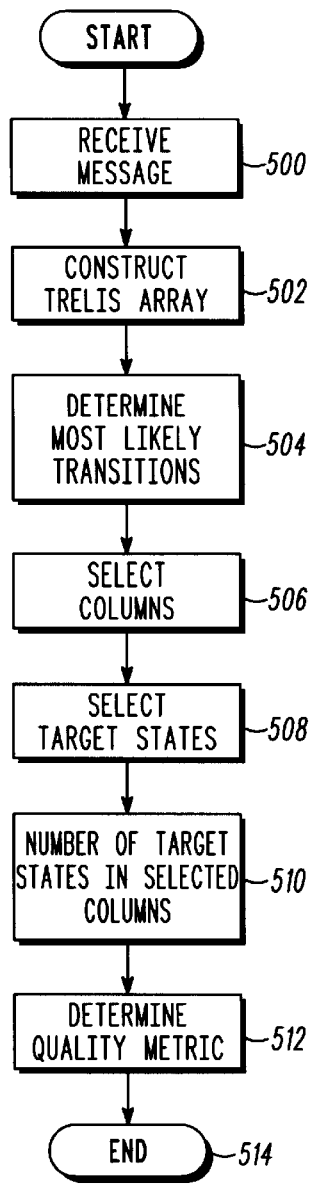
FIG. 5 is a flowchart showing a method of determining a quality metric based on a trellis array in accordance with the invention.

In accordance with the present invention, the trellis decoder also outputs a quality metric 407 to the wireline interface block 409. In one embodiment, the quality metric is determined according to the method of FIG. 5. The method begins at step 500 with the trellis decoder receiving a message. Next, step 502, the trellis decoder constructs a trellis array identifying possible states and branches of the message. It will be appreciated that the trellis array may be virtually any size, based on the number of symbols in the message and the number of possible states. It will further be appreciated that the trellis array may be derived from a conventional web-type trellis diagram, as is known in the art. After the array is constructed, the decoder traces through the array at step 504 to determine the most likely state transitions that were made, as heretofore described in relation to Table 4a and 4b.

At step 506, the decoder selects a number of columns to be considered for purposes of determining the quality metric. In one embodiment, the last column of the data block is not considered because it is associated with a known final state (e.g., zero). In such embodiment, for example, in a trellis array with 49 columns, the first 48 columns would be considered for purposes of determining the quality metric. In general, however, any number of columns of the trellis array may be considered for purposes of determining the quality metric, including the last column.

Next, at step 508, the decoder selects target states to be considered for purposes of determining the quality metric. In a preferred embodiment, the target states define states that are the correct state in each column. For example, in the trellis array of Table 4a, the target state in column "0" is the correct state of "2," the target state in column "1" is the correct state of "0," and so forth. Alternatively, the target states might define the incorrect states in each column, rather than the correct states. In such embodiment, for example, in the trellis array of Table 4a, the target states in column "0" would be the incorrect states "0," "1" or "3," the target states in column "1" would be the incorrect states "1," "2" or "3," and so forth.

At step 510, the decoder determines the number of target states in the selected columns. For example, in the trellis array of Table 4a, there are 4 states in column "0" with the correct state of "2," there are three states in column "1" with the correct state of "0," there are three states in column "2" with the correct state of "1," and so forth. In the trellis array of Table 4b, there are 8 states in column "0" with the correct state of "2," there are seven states in column "1" with the correct state of "0," there are five states in column "2" with the correct state of "2," and so on. It has been observed that trellis arrays constructed for data blocks having no errors will have identical values in each column. In such case, the number of correct states in each column will correspond to the number of possible states (e.g., four for a rate ½ code (Table 4a), eight for a rate ¾ code (Table 4b)). Thus, if the target states are defined as correct states, using the example of Table 4a, there will be four target states in each column if the data block has no errors. Similarly, in the example of Table 4b, there will be eight target states in each column if the data block has no errors. As channel errors are introduced, the values in each column will begin to differ, until ultimately the state transition values will be completely different within each column. Thus, the worst possible decode would have only one target state (correct state transition) in each column. Alternatively, if target states are defined as incorrect states, the best possible decode will have zero target states (incorrect state transitions) in each column and the worst possible decode will have three target states (for a rate ½ code) and seven target states (for a rate ¾ code) in each column.

At step 512, the decoder determines the quality metric based on the number of target states in the selected columns. In a preferred embodiment, the quality metric is the cumulative number of the target states in the selected columns. In the example of Table 4a, using a rate ½ code, assuming that the target states define correct states and that 48 columns are selected for determining the quality metric, the maximum number of the quality metric is 192 (i.e., 4×48) and the minimum value of the quality metric is 48 (i.e., 1×48). In this case, the maximum number 192 represents the best possible decode and the minimum number 48 represents the worst possible decode. Similarly, in the example of Table 4b, using a rate ¾ code, assuming that the target states define correct states and that 48 columns are selected for determining the quality metric, the maximum number of the quality metric is 384 (i.e., 8×48) and the minimum value of the quality metric is 48 (i.e., 1×48). In this case, the maximum number 384 represents the best possible decode and the minimum number 48 represents the worst possible decode.

As another example, consider a system where the target states define incorrect states. For a rate ½ code with 48 columns (e.g., Table 4a), the maximum number of the quality metric is 144 (i.e., 3×48) and the minimum value of the quality metric is 0. In this case, the maximum number 144 represents the worst possible decode and the minimum number 0 represents the best possible decode. Similarly, for a rate ¾ code with 48 columns (e.g., Table 4b), the maximum number of the quality metric is 336 (i.e., 7×48) and the minimum value of the quality metric is 0, the maximum number 336 representing the worst possible decode and the minimum number 0 representing the best possible decode.

It will be appreciated that the quality metric might be implemented in a variety of alternative manners within the scope of the present invention. For example, the target states could be multiplied rather than added, the columns may be weighted differently, the final quality metric may be normalized relative to the size of the array, and so forth. The process ends at step 514 with the decoder sending the quality metric to the wireline interface block 409, where it may be forwarded to other communication units and/or equipment.

It will be appreciated that the quality metric according to the present invention may be used in a variety of ways. In one embodiment, the quality metric information is used to conditionally bypass or disable one or more functions of a communication unit or communication device. For example, consider a communication unit (e.g., mobile or portable radio) that is adapted to calculate the received signal strength of recovered In-Phase (I) and Quadrature (Q) samples to implement a trellis decoding method, as is known in the art. One may forego the actual computation of such signal strengths, and simply assume high signal strengths of the I and Q samples (thereby reducing computation complexity, power, and/or memory requirements of the communication unit) during such time that the quality metric according to the present invention meets a certain threshold. For example, assuming that a high quality metric number represents a good quality decode, the computation of signal strengths of the I and Q samples may be bypassed when the quality metric exceeds a predetermined, relatively high threshold number, because a high quality metric usually corresponds to strong I and Q signals. Conversely, the computation of signal strengths of the I and Q samples may be resumed when the quality metric falls below a certain threshold, which threshold may be the same as or lower than the first threshold.

It will be appreciated that any of several functions might be bypassed, by any of several types of communication devices, based on the quality metric. The present example of conditionally bypassing the computation of I and Q sample signal strength in a communication unit is to be construed as illustrative and not limiting of the present invention. Moreover, it will be appreciated that the bypassing of certain functions may also be accomplished with quality metrics in which lower numbers characterize better decodes than higher numbers. In such case, the function(s) may be bypassed when the quality metric falls below a predetermined, relatively low threshold number, and then resumed when the quality metric rises above a certain threshold, which threshold may be the same as or higher than the first threshold.

The present invention provides a quality metric having a quantifiable value for measuring the quality of trellis decoded block data. In a preferred embodiment, the quality metric is based solely on the states of the trellis array, independent of variations between receivers. The quality metric of the present invention may be used by communication equipment to override certain functions, and enables signals from different receivers (e.g., at multiple sites) to be reliably compared for voting or some other desired purpose.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A method comprising the steps of:
   receiving a message;
   constructing a trellis array associated with the message; and
   determining a quality metric for the message based on the trellis array, wherein the quality metric is derived from state information obtained from selected columns in the trellis array.

2. The method of claim 1 wherein the state information includes a number of occurrences of target states in the selected columns.

3. The method of claim 2 wherein the target states define correct states in the trellis array.

4. The method of claim 2 wherein the target states define incorrect states in the trellis array.

5. The method of claim 2 wherein the quality metric comprises a cumulative number of the occurrences of the target states in the selected columns.

6. The method of claim 1 wherein the step of constructing the trellis array comprises utilizing a trellis decoding method to yield the trellis array.

7. The method of claim 6 wherein the trellis decoding method uses a Viterbi algorithm.

8. The method of claim 1 wherein the step of receiving a message comprises gathering a block of data from the message, the step of constructing the trellis array comprising applying a trellis decoding method to the block of data to yield the trellis array.

9. A method comprising the steps of:
   receiving a message;
   constructing a trellis array associated with the message;
   determining a quality metric for the message based on the trellis array, wherein the quality metric is derived from state information obtained from selected columns in the trellis array; and
   disabling a function of a communication unit based on the quality metric.

10. The method of claim 9 comprising:
    disabling the function when the quality metric exceeds a selected threshold; and
    resuming the function when the quality metric falls below the selected threshold.

11. The method of claim 9 comprising:
    disabling the function when the quality metric exceeds a first threshold; and
    resuming the function when the quality metric falls below a second threshold, the second threshold being lower than the first threshold.

12. The method of claim 9 wherein the step of disabling a function of the communication unit comprises conditionally disabling a portion of a trellis decoding function performed by the communication unit.

13. The method of claim 12 wherein the portion of the trellis decoding function performed by the communication unit includes a computation of signal strength of recovered signals by the communication unit.

14. A method comprising the steps of:
    receiving a block of data defining a number of symbols;
    constructing a trellis array associated with the block of data, wherein the trellis array has a number of columns corresponding to the number of symbols in the block of data; and
    determining a quality metric for the message based on state information in the trellis array, the quality metric being derived from state information obtained from selected ones of the columns of the trellis array.

15. The method of claim 14 wherein the state information includes at least one most likely transition state in each respective one of the selected columns of the trellis array, the quality metric comprising a cumulative number of states matching the most likely transition states in the respective selected columns of the trellis array.

* * * * *